US009491023B2

(12) United States Patent
Butussi et al.

(10) Patent No.: US 9,491,023 B2
(45) Date of Patent: Nov. 8, 2016

(54) SOFT METRICS COMPRESSING METHOD

(75) Inventors: Matteo Butussi, Grand-Saconnex (CH); Stefano Tomasin, Padua (IT); Stefano Rosati, Ecublens (CH)

(73) Assignee: ALi Europe Sarl, Plan-les-Quates (CH)

( * ) Notice: Subject to any disclaimer, the term of this patent is extended or adjusted under 35 U.S.C. 154(b) by 0 days.

(21) Appl. No.: 14/422,149

(22) PCT Filed: Aug. 21, 2012

(86) PCT No.: PCT/EP2012/066286
§ 371 (c)(1),
(2), (4) Date: Feb. 17, 2015

(87) PCT Pub. No.: WO2014/029425
PCT Pub. Date: Feb. 27, 2014

(65) Prior Publication Data
US 2015/0229506 A1 Aug. 13, 2015

(51) Int. Cl.
H04L 27/26 (2006.01)
H03M 13/45 (2006.01)
H04L 1/00 (2006.01)
H04L 25/06 (2006.01)
H03M 7/30 (2006.01)
H03M 7/40 (2006.01)
H03M 13/27 (2006.01)
H03M 13/00 (2006.01)

(52) U.S. Cl.
CPC ............ H04L 27/2649 (2013.01); H03M 7/30 (2013.01); H03M 7/40 (2013.01); H03M 13/27 (2013.01); H03M 13/45 (2013.01); H03M 13/6505 (2013.01); H03M 13/6577 (2013.01); H03M 13/6588 (2013.01); H04L 1/0036 (2013.01); H04L 1/0071 (2013.01); H04L 25/067 (2013.01); H03M 13/6312 (2013.01)

(58) Field of Classification Search
CPC ...... H03M 13/27; H03M 13/45; H03M 7/30; H03M 7/40; H03M 13/6312; H03M 13/6505; H03M 13/6577; H03M 13/6588; H04L 1/0071; H04L 25/067; H04L 1/0036; H04L 27/2649
See application file for complete search history.

(56) References Cited

U.S. PATENT DOCUMENTS

| 2003/0012310 | A1* | 1/2003 | Nagayasu | H04L 1/0045 375/341 |
| 2007/0149135 | A1* | 6/2007 | Larsson | H04B 7/022 455/67.13 |
| 2007/0258531 | A1* | 11/2007 | Chen | H04L 25/067 375/261 |
| 2007/0291864 | A1* | 12/2007 | Ma | H04L 1/0041 375/262 |
| 2009/0103601 | A1 | 4/2009 | Du et al. | |
| 2009/0324116 | A1* | 12/2009 | Takada | G06T 9/007 382/246 |

(Continued)

FOREIGN PATENT DOCUMENTS

| EP | 1562295 | 8/2005 |
| JP | 2003188848 | 7/2003 |

(Continued)

Primary Examiner — Sophia Vlahos
(74) Attorney, Agent, or Firm — J.C. Patents

(57) ABSTRACT

A signal method of processing in a receiver a signal that has been encoded and interleaved in a transmitter comprising: receiving a signal, process the signal to obtain a stream of soft metrics representing bit probability of symbols in a predetermined constellation; applying to said soft metric a compression operation that preserves the total length of each group of soft metrics relative to a same constellation symbol; rearranging the stream of compressed soft metrics so as to inverse the interleaving done in the transmitter.

8 Claims, 7 Drawing Sheets

(56) References Cited

U.S. PATENT DOCUMENTS

2015/0207658 A1* 7/2015 Li .................. H04L 25/067
375/320

FOREIGN PATENT DOCUMENTS

| WO | 2010042901 | 4/2010 |
|----|------------|--------|
| WO | 2011100837 | 8/2011 |

* cited by examiner

SOFT METRICS COMPRESSING METHOD

CROSS-REFERENCE TO RELATED APPLICATION

This application is a 371 application of the International PCT application serial no. PCT/EP2012/066286, filed on Aug. 21, 2012. The entirety of the above-mentioned patent application is hereby incorporated by reference herein and made a part of this specification.

FIELD OF THE INVENTION

The present invention relates to methods for representing and compressing soft metrics in communication systems based on channel coding. In particular, but not exclusively, the present invention relates to signal de-interleaving in a receiver, for example an OFDM receiver.

DESCRIPTION OF RELATED ART AND DEFINITIONS

All modern digital communication systems use channel coding to protect data and allow a better reception. Such is the case, to name just a few examples, of the several Digital Audio and Video Broadcast standards available (DAB and DVB), of wireless networks, including WiFi and Bluetooth in their various implementations, and of modern cellular phone communication systems.

It is customary, in these communication systems, to apply several permutation operators to the data stream. Such permutations, generally indicated as interleaving, are often introduced at the transmitter side and have in general the effect of improving the communication bandwidth and reducing the error rate. According to the cases, interleaving can take place at bit or symbol level, or both. Interleaving introduced in at the transmitter side must in general be undone by a corresponding inverse operation of deinterleaving in the receiver to allow the reconstruction of the original signal.

Known implementation of interleaving and deinterleaving require storing in a memory a sequence of data whose length is equal to the period of the interleaving operator. Since newly proposing communication standards advocate the use of interleaving operator of increasing complexity and length, interleaving and deinterleaving operation place a heavy burden on the memory resources. There is therefore a need of a interleaving and/or deinterleaving method that is less memory demanding than the methods of the art.

BRIEF SUMMARY OF THE INVENTION

According to the invention, these aims are achieved by means of the object of the appended claims.

BRIEF DESCRIPTION OF THE DRAWINGS

The invention will be better understood with the aid of the description of an embodiment given by way of example and illustrated by the figures, in which.

DETAILED DESCRIPTION OF POSSIBLE EMBODIMENTS OF THE INVENTION

This invention concerns methods and devices to represent, compress, de-compress and de-represent data that must be processed by a channel that allows data to be de-compressed, such as, for example: (a) a channel that permutes the order of an incoming signal, (b) a memory where the data are written and then read in another given order, (c) a communication channel.

Figure 1:
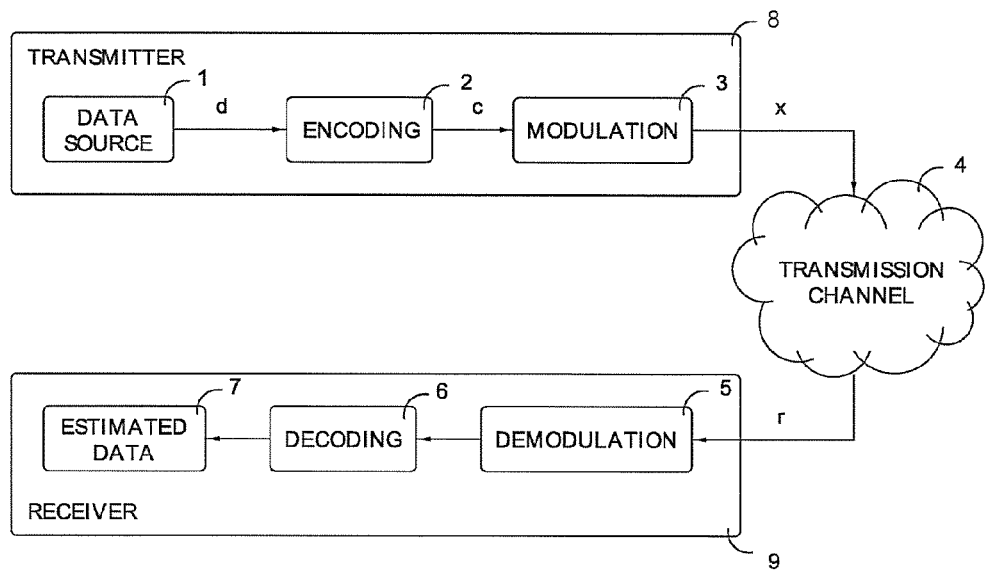
FIG. 1 shows in a schematic fashion a generic communication system using channel coding techniques.

FIG. 1 shows a possible schematic representation of a digital communication system that is composed by a data source 1 generating data belonging to a given finite set. The finite set is usually a binary-valued set. In the following the data generated by the data source will be denoted by d.

Functional block 2, or encoder, is adapted to map the d-data generated by source 1 on words of a given error correcting code. In the field of digital communication system many error correcting codes can be used as: Low Density Parity Check Codes (LDPC), convolutional codes, block codes, etc. The mapping of d in words of error-correction code field is named encoding. In the following the output of block 2 will be indicated by c. The encoded data c are modulated by modulator 3. The transmitter 8 comprises the sequence of the three blocks 1, 2 and 3. Its output, denoted as x, goes through a transmission channel 4 that could be a radio propagation process, a cable transmission, or also a generic operator. The signal emerging from the other side of channel 4 is collected by receiver 9, the received signal is denoted by r. The received signal is processed by block 5 that performs the demodulation of the received signal. The output of Block-5 is then processed by block 6, which performs decoding. The output of Block-6 is an estimate of the transmitted data d The c-stream is transformed by modulator block 3 in another format suitable for transmission. In the following the process performed by Block-3 will be also named modulation. Many techniques can be used for addressing this goal. Nevertheless most of them can be represented as reported in FIG. 2 that illustrates schematically one of the possible implementations of the modulation process.

Figure 2:
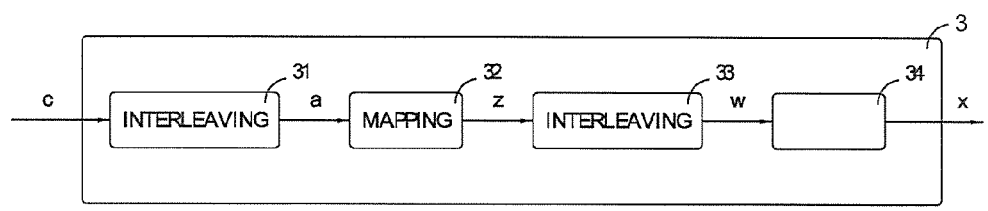
FIG. 2 shows in a schematic fashion a more detailed description of the modulator 3 of FIG. 1.

FIG. 2 shows in a schematic fashion a possible structure of the modulator 3 in the transmitter of FIG. 1. Block-3 can be modelled as the cascade of four sub-blocks. The first sub-block 31 performs the interleaving process. Block-31 performs a permutation of the input signal. The output of Block-31, denoted by a, is processed by mapping block 32. Block-32 maps signal a on the point of a defined constellation that depends on the transmission system in use. The output of Block-32, denoted by z, is processed by the interleaver 33. Block-33 performs a permutation over z and generates signal w that is transformed by Block-34 into a physical signal carrying that constitutes the output x of the transmitter 8 and will be also named transmitted signal. Block 34 could be for example an OFDM modulator, and possibly include a suitable RF interface.

The interleaver block 31 takes a set of the values carried by the c-stream and performs a permutation on it. Denoting the output of Block-30 by a the interleaving rule can be written as follows:

$$a_j = c_i, j = \pi(i), \qquad (1)$$

where $c_i$ is the i-th value carried by the c-stream, $a_j$ is the j-th value carried by the a stream and $\pi$ is a function specific to the chosen modulation standard that defines the permutation performed by Block-30 and it. Since at this stage both signals, c and a, carry binary values (bits), the process performed by Block-31 is also named bit-interleaving.

The schema represented in FIG. 2 is not the only available way to perform the modulation process and different solutions are possible. For this reason, the blocks 31, 32, 33 and 34 can be optional and their sequence can be rearranged in different way.

The mapper block 32 maps the bit carried by the a stream to a finite set of complex numbers also named constellation. Block-32 takes subsets of values carried by a and associates to them a value of a given constellation. Let z be the output of block 32 and $z_k$ its k-th element. $z_k$ is an element of a specific constellation set C that can differ from standard to standard and from transmission to transmission. Indicating with m the rule used in block 32, the relation between a and z can be written as follows:

$$z_k = m(a_i, a_{i+1}, i a_{i+M-1}) \text{ where } a_i, a_{i+1}, a_{i+M-1} \in B \text{ and } z_k \in C. \qquad (2)$$

$a_i$, $a_{\{i+1\}}$, $a_{\{i+M-1\}}$ is the sub-set of values carried by the a-stream and $z_k$ is the value in which they are mapped. In most digital communication systems, $z_k$ is a complex number. Possible values of $z_k$ depend on the considered digital communication system.

Figure 3:
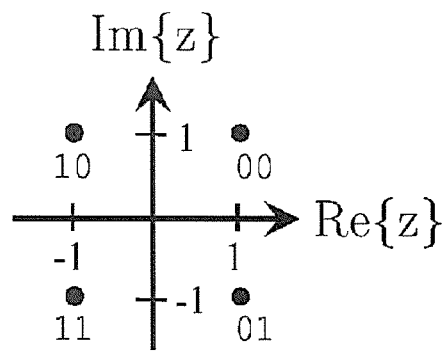
FIGS. 3 and 4 represent schematically two possible constellations used by communication system.
Figure 4:
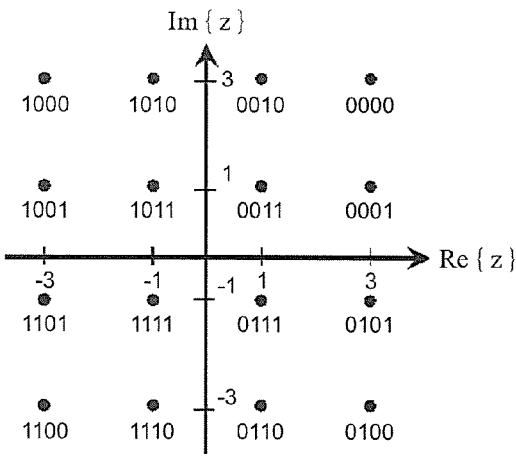

FIGS. 3 and 4 show two constellations used in the DVB-C2 Standard. The constellation reported in FIG. 3 is well known as QPSK. In QPSK, the parameter M, defined in Eq. (2), is equal to 2 and the m-function, introduced in FIG. 3 is defined by the correspondence table:

| $(a_i, a_{i+1})$ | z |
|---|---|
| (0, 0) | 1 + j |
| (0, 1) | 1 − j |
| (1, 0) | −1 + j |
| (1, 1) | −1 − j | where j is the imaginary unit. The map of FIG. 4 maps 4-uples of bits in complex numbers. (1 0 0 0), for example is mapped in −3+j3, (0 1 1 1) is mapped in 1−j, and so on. It is worth noting that these constellations are being superseded, in more recent transmission standards, by larger ones.

The z stream is then processed by the interleaving block 33, which performs, similarly to Block-31, a permutation on values carried by the z stream. The process performed by Block-33 can be written in mathematical form as follows:

$$w_j = z_i, j = \tau(i), \qquad (3)$$

where $z_i$ is the i-th element of the input, $w_j$ is the i-th element of the output and $\tau$ is a given permutation specific to the considered system.

The transmitted signal is modified by the environment or channel 4 visible in FIG. 1 before reaching the receiver. In general, the channel introduces distortions of the transmitted signal and noise. It is usually described as a time-varying filter applied to the transmitted signal and the output of the filtering process is then added to an external signal describing noise and interference from other sources.

Figure 5:
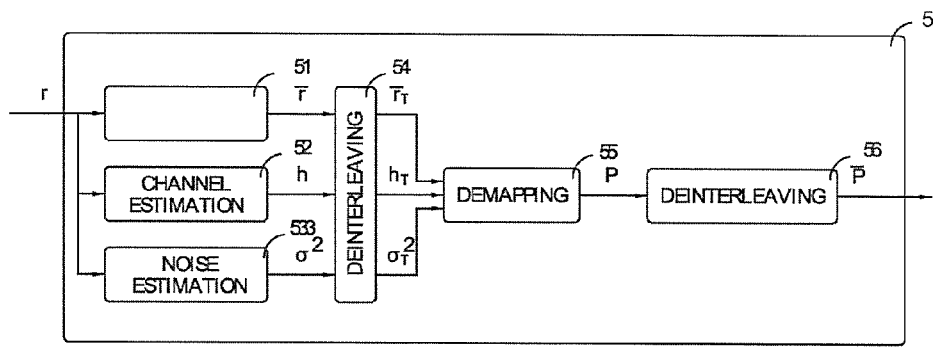
FIG. 5 shows in a schematic fashion one possible implementation of demodulator 5 of FIG. 1.

In the receiver 9 the received signal r emerging from the channel 4 is presented to demodulator block 5. FIG. 5 shows one possible implementation of the demodulation process implementer by block 5. The received signal, r, is processed by three blocks: Block-53, Block-52 and Block-51. Optional block-51 can transform or refine the received signal, change its representation and/or domain, and/or apply other operators, not described here. In OFDM systems the received signal is transformed time-domain to frequency domain. The output of Block-51 will be denoted by $\bar{r}$.

Preferably the receiver performs also in block 52 a channel estimation. The output of the channel estimation is an estimate of the filter frequency or time response that characterizes the channel and will be denoted by h.

Preferably the receiver performs also noise estimation in block-53, The output of Block-53 estimates the power of the noise that affects the receiver signal and will be denoted by $\sigma^2$.

The meaning of the three signals $\bar{r}$, h and $\sigma^2$ can be summarized by the following equation:

$$\bar{r} = hw + n \; E[n^2] = \sigma^2, \qquad (4)$$

where n is a Gaussian variable having power equal to $\sigma^2$, $(E[n^2] = \sigma^2)$.

The three signals $\bar{r}$, h and $\sigma_2$ are processed by Block-54 that introduces a given permutation on each of input signals. Block-54 generates three different outputs: $\bar{r}_\tau$, the permuted version of the $\bar{r}$ signal; $h_\tau$, the permuted version of the h signal; and $\sigma_\tau^2$, the permuted version of the $\sigma^2$ signal. The outputs of Block-54 are used in demapper block 55 to generate estimates of the probabilities of the transmitted signal a. The output of Block-54 will be denoted by P. Signal P is processed by interleaver Block-56, which performs a permutation of the values carried by a and generates signal $\bar{P}$.

In practical implementations $\bar{r}$, h and $\sigma_2$ are signal represented by a finite number of bits. Let $B_{\bar{r}}$, $B_h$ and $B_{\sigma^2}$ the number of bits used to represent respectively signal $\bar{r}$, h and $\sigma^2$. This means that the connection between Block-51 and Block-54 carries $B_{\bar{r}}$-bits, the connection between Block-52 and Block-54 carriers $B_h$-bits and the connection between Block-53 and Block-54 carries $B_{\sigma^2}$-bits. The three-ple ($\bar{r}$, h, $\sigma^2$) is processed by Block-54 as reported in the following equation:

$$\bar{r}_\tau(i) = \bar{r}(j); h_\tau(i) = h(j); \sigma_\tau^2(i) = \sigma^2(j); i = \tau^{-1}(j), \qquad (5)$$

where $\bar{r}_\tau$, $h_\tau$ and $\sigma_\tau^2$ are the three signals generated by Block-54, $\tau^{-1}$ is the inverse of the $\tau$ permutation used at the transmitter side by Block-33.

The three-ple ($\bar{r}_\tau$, $h_\tau$ and $\sigma_\tau^2$) is processed by the demapper 55 whose goal is the computation that a given transmitted bit in a received symbol be '0' or '1'. More formally, the demapper 55 provides the probability of $a_i = \bar{a}$ for every i and for every $\bar{a} \in B$:

$$P(a_i = \bar{a} | \bar{r}_\tau(k), h_\tau(k), \sigma_\tau^2(k)) \forall \bar{a} \in B \forall i. \qquad (6)$$

In the following for the sake of simplicity the above reported probability we will be also denoted by $P_i(\bar{a})$.

In the usual case of binary transmitted values $B=\{0,1\}$, block-55 must compute two probability values for each $a_i$ transmitted value: $P_i(0)$ and $P_i(1)$. Probabilities $P_i(0)$ and $P_i(1)$ are commonly indicated as 'soft metrics' and in case of binary values they can be represented by a unique value named Log Likelihood Ratio:

$$LLR_i = \ln \frac{P_i(0)}{P_i(1)} \quad (7)$$

Before starting the decoding in block-6, the receiver 9 must re-organize the sequence $\{P_i(\bar{a})\}_i$. Block-56 re-arranges the sequence in the following way:

$$P_j(\bar{a}) = P_i(\bar{a}) j = \pi^{-1}(i), \quad (8)$$

where $\pi^{-1}(i)$ is the inverse of the $\pi$-permutation used at the transmitter side by Block-31.

To perform the permutations $\pi^{-1}(i)$ and $\tau^{-1}(i)$, Blocks 54 and 56 need memory. In all the systems the permutations $\pi$ and $\tau$ are applied on a finite sequence:

$$\pi(i) \text{ and } \pi^{-1}(i) \text{ are defined for } i=1, \ldots, N_\pi \quad (9)$$

$$\tau(i) \text{ and } \tau^{-1}(i) \text{ are defined for } i=1, \ldots, N_\tau \quad (10)$$

The memory used by Block-54 and Block-56 depends on $N_\pi$ and $N_\tau$. Assuming to efficiently implement the de-interleavers performed by Block-54 and Block-56, the memory used by Block-54 and by Block-56 is respectively composed by $N_\pi$ and $N_\tau$ words.

For Block-54 one word is represented by three-pie ($\bar{r}$, h, $\sigma^2$). Hence the memory used by Block-54 depends on the number of bits used to represent the three signals $\bar{r}$, h and $\sigma^2$. Let $B_r$, $B_h$ and $B_\sigma$ be the number of bits used to represent the three signals, it follows that the memory used by Block-54 is equal to:

$$M_{54} = B_r + B_h + B_\sigma) \times N_\tau \text{ bits.} \quad (11)$$

For Block-56 one word is represented by the a K-dimensional vector or K-uple $[P_i(\bar{a}_1), P_i(\bar{a}_2), \ldots P_i(\bar{a}_K)]$, where K is the cardinality of B and $\bar{a}_1, \bar{a}_2, \ldots \bar{a}_k$ are all the possible elements of B. Using $B_P$ bits for the representation of the generic $P_i(\bar{a})$ value, it follows that the memory used by Block-56 is equal to:

$$M_{56} = B_P \times K \times N_\tau \text{ bits.} \quad (12)$$

In the case of a binary B-alphabet and using the LLR representation it follows that the deinterleaving operation performed by Block-56 is based on words of one single value. Assuming $B_{LLR}$ bits for the representation of the LLR, it follows that the memory used by Block-56 is equal to:

$$M_{56} = B_{LLR} \times N_\tau \text{ bits.} \quad (13)$$

Figure 6:
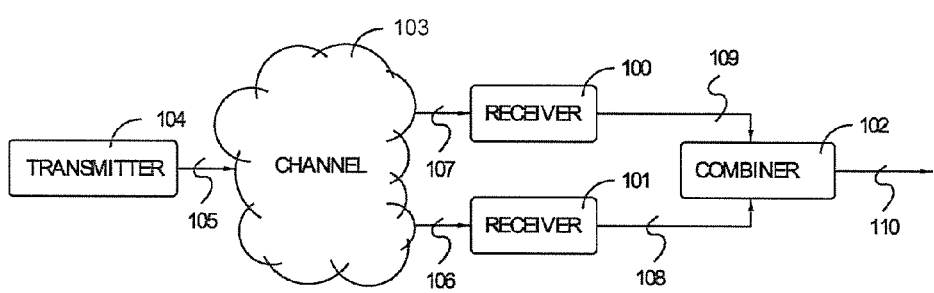
FIGS. 6 and 7 illustrates schematically a diversity transmission system in which a transmitter transmits a signal that is received by two receivers and combined to improve the system reception quality.
Figure 7:
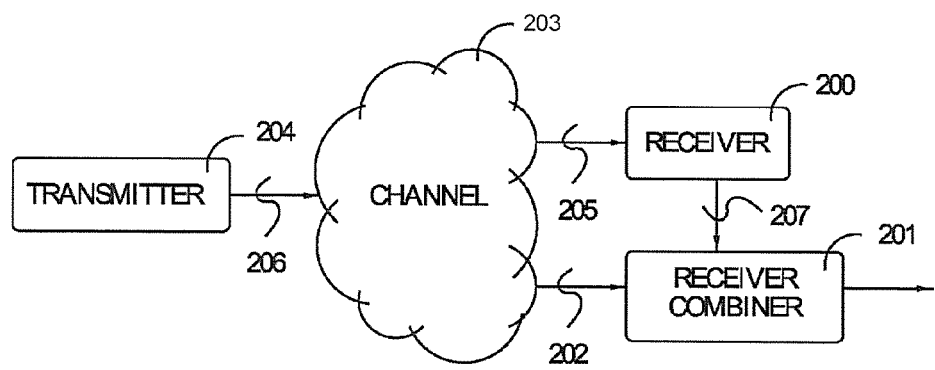

Another field in which the invention is intended to be used is illustrated in schematic form in FIG. 6 and in FIG. 7. FIGS. 6 and 7 show in a schematic fashion a family of process known as Diversity Combining.

FIG. 6 illustrates schematically a diversity transmission system in which a transmitter 104, transmits a given signal 105 that goes through the channel 103, is received by two receivers 100 and 101 that transmit information useful for the reception to the combiner 102. Block-100 and Block-101 can be arranged to transmit and/or receive one or more of the signal present in the demodulator 5 of FIG. 5, for example the de-interleaved sequence P generated by de-interleaver 56, the received signal r, the processed signal $\bar{r}$, the signal $\bar{r}_\tau$, provided by de-interleaver 54 or the demapped stream P. The combiner 102, receives these signals and estimates the transmitted data d. FIG. 7 shows an alternative architecture in which one receiver 200, transmits information useful for the reception to an unit 201 that unites the roles of receiver and combiner. The information transmitted by Block-200 is the same kind of information transmitted by Block-100 and Block-101 to Block-102. Block-201 uses this information to estimate the transmitted data d.

Block-54 and Block-56 of FIG. 5 are two different examples of applications of the invention. Another examples of channels to which the invention is applicable are, in FIGS. 6 and 7, the transmission of information from Block-100 and from Block-101 to Block-102, respectively from Block-200 to Block-201.

FIG. 7 shows another diversity transmission system in which a transmitter, 204 transmits a given signal 206 through the channel 203. The information, differently altered by the channel 203, is received by blocks 200 and 201. Block-200 transmits to Block-201 information about Signal-205. Block-201, analyzing Signal-202 and the information received by Block-200, performs an estimation of the transmitted information.

Figure 8:
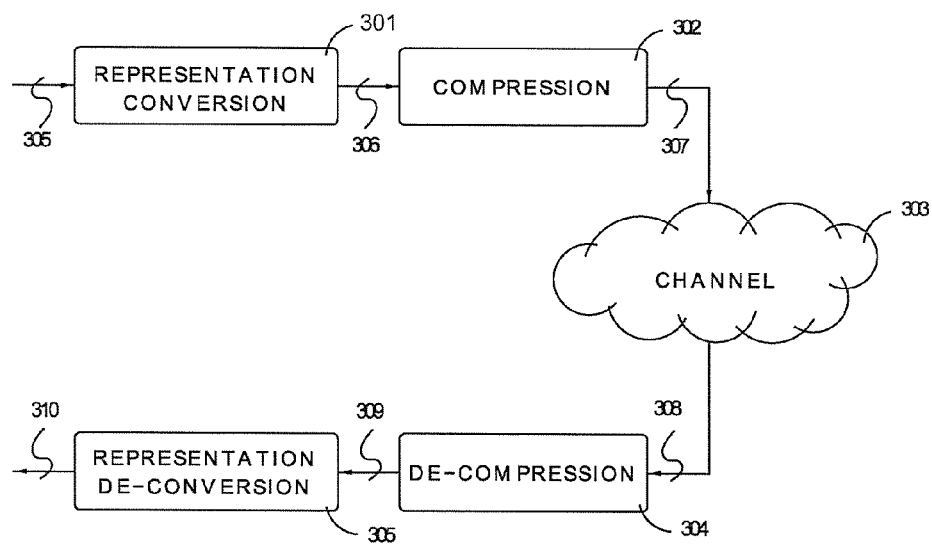
FIG. 8 represents schematically a variant of the invention.

FIG. 8 shows in a schematic fashion a possible variant of the invention that encompasses four different phases.

In the inventive signal processing method an input signal 305 is fed to a representation conversion block-301 that changes representation of the values carried by signal 305 in another format. The format change can be a permutation, an interleaving, a mapping, or a general conversion operation, represented by a suitable operator, and may also in cases cause information loss.

The first phase, see Block-301, is the change of the representation used of the incoming signal. Signal-305 is represented using a given number of bits. In most of the systems each element of Signal-305 is represented using a constant number of bits. Indicating with $S_n^{(305)}$ the generic n-th element of Signal-305 and by $B_n^{(305)}$ the number of bits used to represent it, it follows that:

$$B_i^{(305)} = B_j^{(305)} = B^{(305)} \forall i,j. \quad (14)$$

Block-301 changes the representation used for Signal-305 and generates Signal-306. Possibly, the number of bits used for the representation of Signal-306 is not constant through the stream. Denoting by $S_n^{(306)}$ the generic n-th element of Signal-306 and by $B_n^{(306)}$ the number of bits used to represent it, it can happen that:

$$B_n^{(306)} \neq B_m^{(306)}. \quad (15)$$

Relaxing the constraint on the constant number of bits used for the signal entering Block-301 allows to optimize the total number of bits used of the representation of Signal-305. The optimization of the used bits depends on the nature of Signal-305. Section "LLR Quantization" reports a possible bit-width optimization in case of Signal-305 carrying LLR values.

The representation conversion is followed by a compression step carried out by Block-302 that generates Signal-307.

Signal-306 is then compressed by Block-302. The compression is designed taking into account the statistic of the elements of Signal-306. It can be applied on each value $S_n^{(306)}$ or on words composed by M elements of Signal-306. Let $w_i^{(306)}$ be the generic word composed by M elements of Signal-306, which can be expressed in the mathematical form as follows:

$$w_i^{(306)} = [S_{j_1(i)}^{(306)}, S_{j_2(i)}^{(306)}, \ldots, S_{j_M(i)}^{(306)}], \quad (16)$$

where $w_i^{(306)}$ is a vector composed by M elements and $j_1(i)$, $j_2(i)$, ... $j_M(i)$ are the indices of the $S^{(306)}$-values that compose the word $w_i^{(306)}$. A simple solution to generate the word $w_i^{(306)}$ could be to take M consecutive elements of Signal-306. In that case the word can be written as follows:

$$w_i^{(306)} = [S_{iM}^{(306)}, S_{iM+1}^{(306)}, \ldots, S_{iM+M-1}^{(306)}]. \quad (17)$$

Moreover the compression code applied on the n-th value, $S_n^{(306)}$, is in general different from the compression code applied on the m-th values $S_m^{(306)}$.

Figure 9:
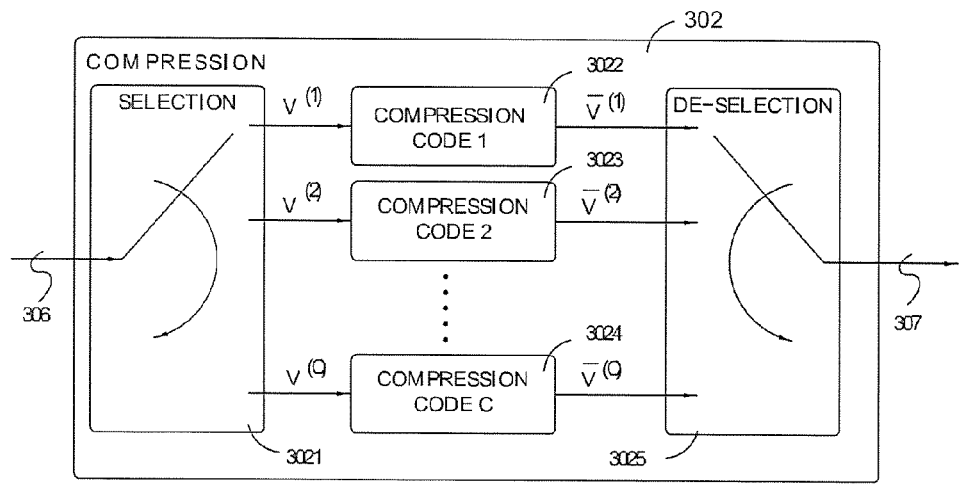
FIG. 9 shows in a schematic fashion a possible representation of the compression unit 302 of FIG. 8.

FIG. 9 reports in a schematic fashion a possible implementation of Block-302. Block-302 can perform C different compressions. This means that Block-32 is able to apply C different compression codes. Each compression code can be pre-computed or dynamically adapted to the incoming signal. Each compression code is designed for a signal having a given statistical description.

Selector block-3021 is the first stage of the compressor Block-302. It assigns the values carried by Signal-306 to the C different compression codes available, each represented by one of the blocks 3022 to 3024. The outputs $\bar{v}^{(1)}, \bar{v}^{(2)}, \ldots \bar{v}^{(C)}$ of the compression codes are merged in a single signal by de-selector block-3025. The generated signal, Signal-307, is the output of Block-302.

In case of pre-computed compression codes, the assignment performed by Block-3021 is done in such a way that the signal, at the input of the n-th compression code, fits as much as possible the statistical description for which the n-th compression code has been designed. In case of adaptive compression codes the assignment is done in such a way that the signal at the input of each compression code will be as much as possible non-uniformly distributed. The goal of Block-3021 is to guarantee a signal, at the input of each compression, having a statistical description suitable for an efficient compression code design.

In the following, the input of i-th compression code will be denoted by $v^i$, and its n-th element by $v^i(n)$. Signal $v^i$ can be composed by a sequence of elements of $S^{(306)}$-values or by a sequence of elements of $w^{(306)}$. The output of the compression codes is then rearranged by Block-3025 in the inverse order used by Block-3021 to assigned the values of Signal-306 to the different compression codes.

Different kinds of compression codes can be used for the compression, including (but not only) entropy coding algorithms and dictionary-based algorithms. If the distribution of the symbol values is known beforehand, arithmetic coding (or Huffman coding) is very well suited.

Some compression codes, in particular entropy coding generate code words of variable length, and it is difficult to guarantee that code words generated in correspondence to unusual combinations of input do not exceed a given maximum length. Preferably the present invention proposes a process to limit the length of the word generated by the compression code.

Let $V_i$ be the alphabet of the words at the input of the i-th compression code. Let $C_i$ the rule used the i-th code to generate the output words:

$$\bar{v}^{(i)}(n) = C_i(v^{(i)}(n))v^{(i)}(n) \in V_i. \quad (18)$$

where $v^{(i)}(n)$ is the n-th word at the input of the i-th compression code.

Let $\bar{V}_i$ be the set of the words generated using the above reported rule:

$$\bar{V}_i = \{\bar{v}^{(i)}(n) | \bar{v}^{(i)}(n) = C_i(v^{(i)}(n)) \cdot v^{(i)}(n) \in V_i\} \quad (19)$$

The i-th compression code is designed to compress as much as possible the input $v^{(i)}$. Nevertheless it could happen that some words of the set $\bar{V}_i$ exceed the maximum length $L_i$:

$$V_i^{(L)} = \{v | v \in V_i \text{ and length } [C_i(v)] \le L_i\}. \quad (21)$$

Let $V_i^{(L)}$ be the subset of $V_i$ that does not generate words exceeding the maximum length:

$$V_i^{(L)} = \{v | v \in V_i \text{ and length } [C_i(v)] \le L_i\}. \quad (21)$$

The i-th code analyzes the output generated by $v^{(i)}(n)$ using the rule $C_i$; if the output exceeds the maximum length the code modifies the input, from $v^{(i)}(n)$ to $\hat{v}^{(i)}(n)$, in such a way that the output, generated by $\hat{v}^{(i)}(n)$, has the wanted length. That means that $\hat{v}^i(n)$ must be in $V_i^{(L)}$.

The generation of $\hat{v}^{(i)}(n)$ must take into account system performance and length constraints. The use of $\hat{v}^{(i)}(n)$ in place $v^{(i)}(n)$ must generate the performance loss as small as possible. The technique used to map a given $v^{(i)}(n)$ into $\hat{v}^{(i)}(n)$ depends on the system on which the present invention is applied. The impact of using $\hat{v}^{(i)}(n)$ in place $v^{(i)}(n)$ can be represented as a cost function that must be minimized. It follows that $\hat{v}$ is selected using the following rule:

$$\hat{v}^{(i)}(n) = \arg \min_{x \in V_i^{(L)}} f(x, v^{(i)}(n)), \quad (22)$$

where f is a generic cost function and $\hat{v}^{(i)}(n)$ is the element of $V_i^{(L)}$ that minimizes the cost function given $v^{(i)}(n)$.

A simple example of cost function is the distance function.

Another constraint can be imposed on the total lengths of the words generated by the C compression codes. At a given instant n the sum of the length of the words generated by the C compression codes cannot exceed a given value. This constraint can be written in a mathematical form as follows:

$$\sum_{i=1}^{C} \text{length}[\bar{v}^{(i)}(n)] \le L. \quad (23)$$

It could happen that a given instant n the above reported constraint is not verified. In that case the invention changes the values $v^{(1)}(n), \ldots, v^{(C)}(n)$ that have generated the too long sequence $\bar{v}^{(1)}(n), \ldots, \bar{v}^{(C)}(n)$ in such a way that the new generated sequence will have the right length. The change of the sequence $v^{(1)}(n), \ldots, v^{(C)}(n)$ must take into account the system performance and the length constraint.

A compression method subject to the constraint expressed by equation (23) is particularly useful in de-interleaving a stream of soft metrics in a receiver, for example. In this case, as it will be seen further on, the constraint 23 can be enforced to ensure that the total length of each group of compressed soft metrics relative to a same constellation symbol be preserved. Thanks to this feature, the compressed soft metrics can be de-interleaved as easily as the uncompressed ones, albeit with reduced memory usage.

The goal of both Block-301 and Block-302 is to reduce the number of bits used to represent the values carried by Signal-305. A set of M values carried by Signal-305 is represented using:

$$[B^{(305)} \times M] \text{ bits.} \quad (24)$$

The number of bits used by Signal-307 to carry the same information can be difficulty written in close form. Nevertheless, considering the worst case, in which all the words generated by the i-th code have maximum length, it follows that the number of bit used by Signal-307 to carry the same information is upper bounded by the following equation:

$$\left[\sum_{i=1}^{C} B^{(L_i)} M_i\right] \text{bits,} \quad (25)$$

where $M_i$ is the number of words generated by the i-th compression code for the process associated to the M values carried by Signal-305 and $B^{(L_i)}$ are the number of bits used to represent to longest code word generated by i-th compression. A good constraint to guarantee that the invention generates less bits than the bits used in Signal-305 is to impose that:

$$\sum_{i=1}^{C} B^{(L_i)} M_i \leq B^{(305)} M. \quad (26)$$

The compressed signal-307 goes then through a channel 303 that might be a physical propagation channel, but also a generic operation on the signal, for example a non-distortion process, from which it emerges as signal 308, and is further processed by Block-304. Block-304 performs inverts the compression step previously applied by Block-302 in order to generate Signal-309 in the same format as Signal-306.

Figure 10:
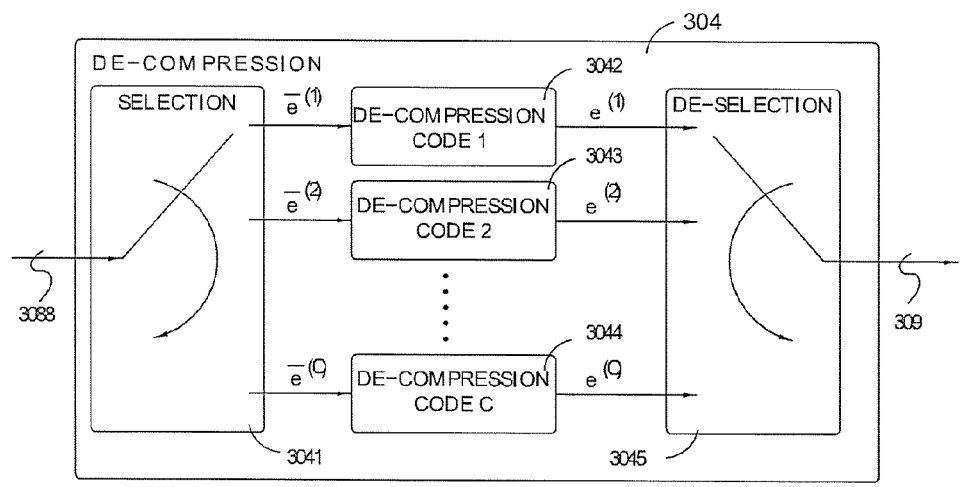
FIG. 10 represents schematically a possible structure of decompression unit 304 of FIG. 8.

Signal-308 is decompressed by Block-304, Block-304 performs the inverse of process previously performed by Block-302. FIG. 10 reports in a schematic fashion a possible implementation of Block-308. Analogously to the compressor of FIG. 9, there are C de-compression codes: Block-3042, Block-3043, ... Block-3044. The assignment rules applied by Block-3041 are the inverse of the rules used by Block-3025. The outputs of the de-compression codes are merged in a single signal by Block-3045. The assignment rules applied by Block-3045 are the inverse of the rules used by Block-3021.

Signal-308 is split in C different signals: $\bar{e}_1, \bar{e}_2, \ldots \bar{e}_C$. The rules used by Block-308 permit to re-build at input of the i-th de-compression code (Block-3042, Block-3043, ... Block-3044) the code words previously coded by the i-th compression code.

The generic signal $\bar{e}^{(i)}$ is processed by the i-th de-compression code. The i-th de-compression code performs the inverse of the mapping performed by the i-th compression code. Denoting by $\bar{e}^{(i)}(n)$ and by $e^{(i)}(n)$ the input and the output of the i-th de-compression, the process performed by Block-3042, Block-3043, ... Block-3044, can be written in mathematical form as follows:

$$e^{(i)}(n) = C_i^{-1}(\bar{e}^{(i)}(n)), \quad (27)$$

where $C_i^{-1}$ is the inverse of the $C_i$-function reported in Eq. 18.

The $e^i$ signals are reordered by Block-3045 which performs the inverse of the process previously executed by Block-3021. The output of Block-3045 is the Signal-309.

The last step is to represent Signal-309 in a format coherent with the representation used for Signal-305. This task is performed by Block-305 which performs the inverse of the process previously performed by Block-301.

LLR Quantization

This section focuses on Block-301 in case of a Signal-305 carrying LLR values. In such case Signal-305 is a sequence of LLR values. The n-th value of Signal-305 is a LLR value associated to a transmitted/received bit.

All the LLR are represented using the same number of bits. Block-301 changes the representation of the n-th LLR values.

The change of the representation is based on the position in the constellation of the bit carried by the LLR value.

Signal-305 can be divided into groups of M elements, $S_{j_k}^{(305)}$, with k=1, 2, ..., M, where M is the number of bits associated at each received constellation point. The set:

$$\{S_{j_1}^{(305)}, S_{j_2}^{(305)} \ldots, S_{j_M}^{(305)}\} \quad (28)$$

is the set of the LLRs of the bits associated at the same received/transmitted constellation point.

Block-301 quantizes Signal-305 by a quantizer, where to each input value $S_{j_k}^{(305)}$, one of the $G_k = 2^{l_k}$ quantized values—where $l_k = B_{j_k}^{(306)}$ is the number of bits used to describe each level—is associated. Various techniques can be adopted for this quantization procedure. The process performed by Block-301 can be based on uniform or non-uniform quantization techniques.

In a possible embodiment, each quantized value is associated to a quantization interval $[v_{k,v-1}, v_{k,v}]$, where $v_{k,0} = -\infty$ and $v_{k,G_k} = \infty$ and the intervals are a partition of the real numbers. In the case of a uniform quantizer, $v_{\{k,v\}} = \Delta_k v$ for $v=1, \ldots, G_k-1$ where $\Delta$ is a positive real number representing the quantization step.

Then, the value associated to $S_{j_k}^{(305)}$ is the index of the interval in which $S_{j_k}^{(305)}$ falls. The quantized LLR is therefore $$S_{j_k}^{(306)} = \{v^*: S_{j_k}^{(305)} \in [v_{k,v^*-1}, v_{k,v^*}]\} = Q(S_{j_k}^{(305)}), \quad (29)$$

where Q is the quantization function, denoting the process performed by Block-301.

Various approaches can be followed for the choice of the quantization interval edges $v_{k,v}$. One possible implementation provides that they are chosen according to the statistics of Signal-305 in order to maximize the generalized mutual information between the transmitted bits and Signal-306, which provides the maximum achievable for given quantization choice. Considering a decoder having as input the quantized LLR, and assuming equiprobable inputs, the generalized mutual information can be written as $$S_{j_k}^{(306)} = \{v^*: S_{j_k}^{(305)} \in [v_{k,v^*-1}, v_{k,v^*}]\} = Q(S_{j_k}^{(305)}), \quad (30)$$

with $$GMI_n(B_n^{(306)}) = 1 - \sum_{v=1}^{G_k-1} \frac{1}{2} p(S_{j_k}^{(306)} = v, b_{j,k} = 0) \quad (31)$$

$$\log(1 + e^{-\lambda(v)s}) + + \frac{1}{2} p(S_{j_k}^{(306)} = v, b_{j,k} = 1)\log(1 + e^{\lambda(v)s}),$$

where $p(S_{j_k}^{(306)}=v, b_{j,k}=b)$ is the joint probability that $S_{j_k}^{(306)}=v$ and $b_{j,k}=b$, and $\lambda(v)$ is the quantized value associated with v. The maximum GMI is achieved when $$\lambda(v) = c \frac{p(S_{j_k}^{(306)} = v, b_{j,k} = 0)}{p(S_{j_k}^{(306)} = v, b_{j,k} = 1)}, \quad (32)$$

for any c>0, and in this case the generalized mutual information coincides with the mutual information and the corresponding transmitted bit, i.e.

$$GMI_n(B_n^{(306)}) = MI_n(B_n^{(306)}) = \qquad (33)$$

$$\sum_{b=0}^{1} \sum_{v=1}^{G_k-1} p(S_{j_k}^{(306)} = v, b_{b,k} = b) \log \frac{2 p(S_{j_k}^{(306)} = v, b_{j,k} = b)}{p(S_{j_k}^{(306)} = v)},$$

where $p(S_{j_k}^{(306)}=v)$ is the probability that $S\_(j\_k)\hat{}((306))=v$.

In a possible embodiment, the quantization process could be designed in such a way that it maximizes the sum of the mutual information of the LLR associated to the same transmitted/receiver constellation point, under a constraint on the total bits used for the set reported in Eq. (28):

$$\max_Q \left\{ \sum_{k=1}^{M} MI_{j_k}(B_{j_k}^{(306)}) \right\} \text{ and } \sum_{k=1}^{M} B_{j_k}^{(306)} \leq B_{tot}. \quad (34)$$

Assuming an uniform quantization, the solution of the above reported problem needs the computation of M quantization steps, $\Delta_1, \ldots, \Delta_M$, and M bit-width, $l_1, \ldots, l_M$. Different techniques can be used to solve Eq. (34). The quantizing operation generates a constant number of bits for each group of soft metrics relative to a same constellation symbol or different number of bits for each soft metric relative to a same constellation symbol.

Assuming to use a 16-QAM constellation, each constellation point carries 4 bits (M-4). Let's assume that $B_{tot}$, the number reported in Eq. (34) is equal to 16, ($B_{tot}=16$). In case of constant bit-width it follows that: $B_{j1}=B_{j2}=B_{j3}=B_{j4}=4$. Note that $B_{j1}+B_{j2}+B_{j3}+B_{j4}=16$. Otherwise, it could happen, that maximising the mutual information, see Eq (34), the bit-width is not constant, example: $B_{j1}=5$, $B_{j2}=5$, $B_{j3}=3$ and $B_{j4}=3$. Note, that also in this second case the constraint is satisfied, $B_{j1}+B_{j2}\ B_{j3}+B_{j4}=16$.

Compression

As an embodiment of compression, Block-302 provides the use of Huffman coding on each element $S_{j_k}^{(306)}$. In this case the size of the word associated with v is $$m_{k,v} = \left\lceil \log \frac{1}{p_k(v)} \right\rceil, \quad (35)$$

where $p(v_k)$ is the probability that $S_{j_k}^{(306)}=v$.

If $$\text{length}[\bar{v}] \leq L_i \qquad (36)$$

then $\hat{v}_i = \hat{v}$ and in this case we have lossless compression and the only penalty for the system performance is the quantization process. Otherwise, when length $[\bar{v}] > L_i$, we replace some quantized LLR value. In this case, the compression introduces a further distortion in the representation of the LLR, beyond that of the quantizer.

The choice of the LLRs to be substituted and their replacement will have an impact on the system performance. Note that while quantization and entropy coding are performed for each bit separately, the compression is done on the ensemble of the LLRs of all the bits. This problem can be seen as a multidimensional multiple choice knapsack problem. Unfortunately, this problem is NP hard problem, thus a possible embodiment of provides the use of a greedy approach for the compression.

We consider the following iterative procedure:
1. Let $\hat{v}((1))(n)$ be the quantized indices values obtained by Block-301.
2. Initialize $\hat{v}^{(i)}(n)=v^{(i)}(n)$, i=1, ..., M.
3. If (36) is satisfied, terminate the process.
4. Otherwise, find $$\hat{v}^{(i)}(n) = \arg \min_{i,x \in V_i^{(L)} \setminus \hat{v}^{(i)}(n)} f(x, \hat{v}^{(i)}(n)), \quad (37)$$

A possible expression of the cost function f is the MI loss, i.e.

$$f(x, \hat{v}^{(i)}(n)) = \sum_{b=0}^{1} \sum_{v=1}^{G_k-1} p(S_{j_k}^{(306)} = \hat{v}^{(i)}(n), b_{j,k} = b) \qquad (38)$$

$$\log \frac{2 p(S_{j_k}^{(306)} = \hat{v}^{(i)}(n), b_{j,k} = b)}{p(S_{j_k}^{(306)} = \hat{v}^{(i)}(n))} -$$

$$\sum_{b=0}^{1} \sum_{v=1}^{G_k-1} [p(S_{j_k}^{(306)} = \hat{v}^{(i)}(n), b_{j,k} = b) + p(S_{j_k}^{(306)} = x, b_{j,k} = b)]$$

$$\log \frac{2[p(S_{j_k}^{(306)} = x, b_{j,k} = b) + p(S_{j_k}^{(306)} = \hat{v}^{(i)}(n), b_{j,k} = b)]}{[p(S_{j_k}^{(306)} = x) + p(S_{j_k}^{(306)} = \hat{v}^{(i)}(n))]}$$

In this case, among all quantized value that have a given length, the one providing the highest MI is selected.

EXAMPLE I

Figure 11:
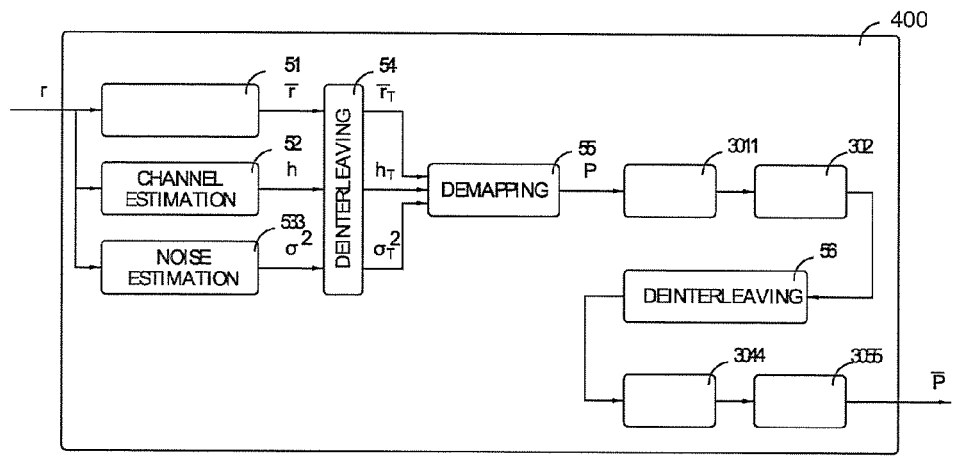
FIGS. 11 and 12 are schematic examples of possible integrations of the invention in the demodulation process, for example in the demodulator 5 of FIG. 1.

The invention can be applied to the demodulation process. FIG. 11 shows in schematic fashion a variant of the demodulation process of FIG. 5. Demapper 55 generates a stream P of soft metrics representing, for example the probability that a bit in the transmitted signal stream be '0' or '1'.

Optional block 301 represents a quantizer unit, or any other suitable process block that transforms the representation of the soft metrics generated by the demapper, and then compressed by compressor unit 02. The output of Block-32 is then processed by Block-56. Since the number of bits used to represent Signal-307 are less than the number of bit used for the P signal, the de-interleaver 56 of this variant of the invention uses less memory. The output of the de-interleaver 56 is then decompressed by Block-304 and optionally further processed by Block-305, for example to change or adapt its representation, according to the needs.

Figure 12:
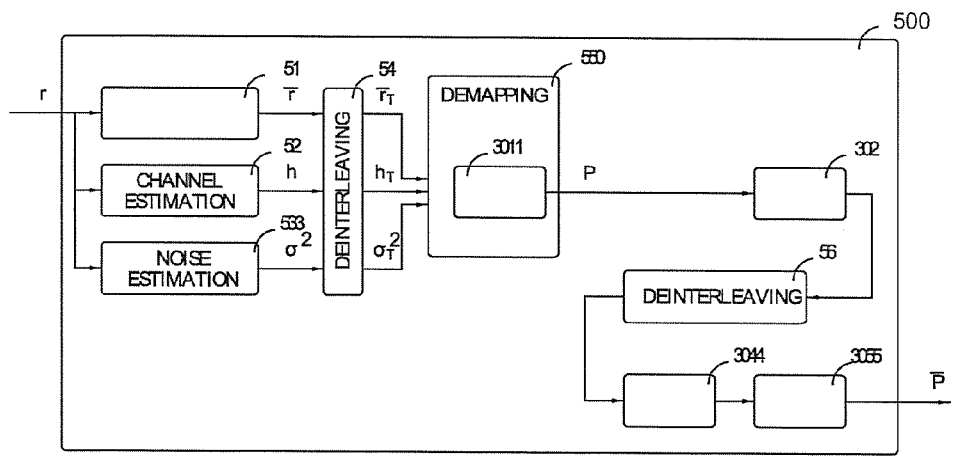

FIG. 12 represents a further variant in which the quantizer 301 directly integrated in the demapper, Block-550.

EXAMPLE II

Figure 13:
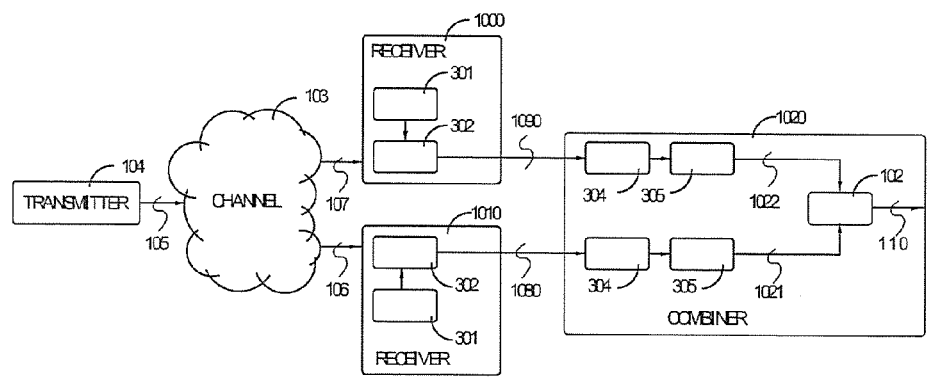
FIGS. 13 and 14 shows in a schematic fashion the integration of the invention in a diversity system akin to those represented in FIGS. 6 and 7.
Figure 15:
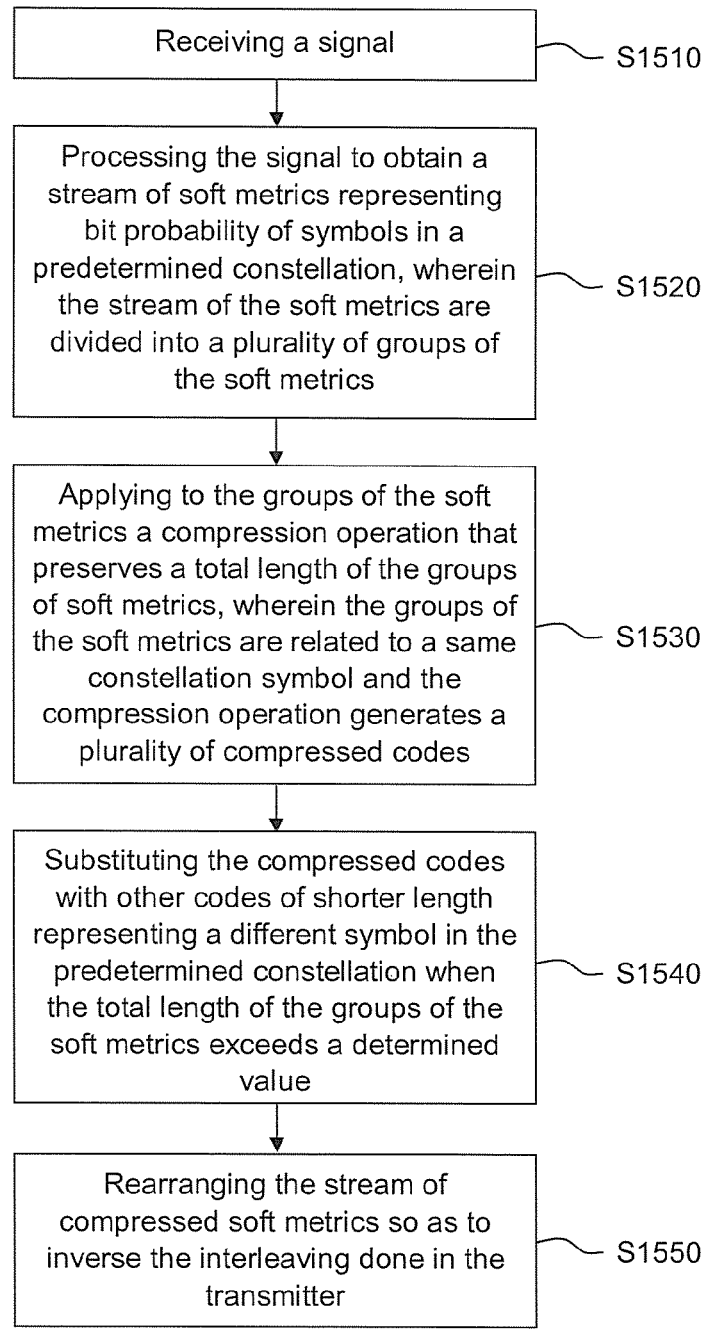
FIG. 15 is a flow chart depicting a method of processing in a receiver a signal that has been encoded and interleaved in a transmitter in one embodiment of the invention.

The invention can be applied to a diversity receiver akin to that represented in FIG. 6. FIG. 13 shows in a schematic fashion a this variant of the invention. The two receivers, Block-1000 and Block-1011, apply the representation conversion and the decompression to the signals before transmission. In this way, the receivers decrease the total amount of information to transmit to Block-1020. Signal-1090 and Signal-1080 are first applied to Block-304 and Block-305. The generated signal is denoted Signal-1022. Signal-1080 is processed by a second block chain, as Signal-1090. The generated signal is denoted Signal-1021. Signal-1022 and Signal-1021 are equivalent to Signal-109 and Signal-108 of FIG. 6). The combiner must re-convert Signal-1022 and Signal-1021 in a format suitable for Block-102. This is why both received signals are first processed by Block-304 and then by Block-305. FIG. 15 is a flow chart depicting a method of processing in a receiver a signal that has been encoded and interleaved in a transmitter in one embodiment of the invention. Referring to FIG.15, in step S1510, the signal is received. In step S1520, the signal is processed to obtain a stream of soft metrics representing bit probability of symbols in a predetermined constellation, wherein the stream of the soft metrics are divided into a plurality of groups of the soft metrics. In step S1530, a compression operation is applied to the groups of the soft metrics to preserve a total length of the groups of soft metrics, wherein the groups of the soft metrics are related to a same constellation symbol and the compression operation generates a plurality of compressed codes. In step S1540, the compressed codes is substituted with other codes of shorter length representing a different symbol in the predetermined constellation when the total length of the groups of the soft metrics exceeds a determined value. In step S1550, the stream of compressed soft metrics is rearranged so as to inverse the interleaving done in the transmitter.

Figure 14:
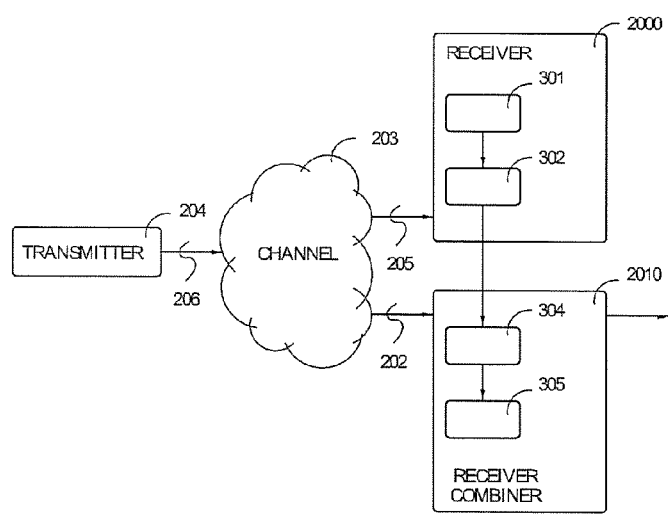

The invention can also be applied to the system reported in FIG. 7. FIG. 14 shows in a schematic fashion a new version of that system. The receiver, Block-2000, changes the representation and compress the information before transmission. The representation conversion is performed by Block-301 and the compression by Block-302. The transmitted signal is received by Block-2010, that must re-convert the signal into a format equivalent to that of Signal-207. This is why Block-2010 must apply on the received signal the process performed by Block-304 and by Block-305.

The invention claimed is:

1. A method of processing in a receiver a signal that has been encoded and interleaved in a transmitter comprising:
   receiving the signal;
   process the signal to obtain a stream of soft metrics representing bit probability of symbols in a predetermined constellation, wherein the stream of the soft metrics are divided into a plurality of groups of the soft metrics;
   applying to the groups of the soft metrics a compression operation that preserves a total length of the groups of soft metrics, wherein the groups of the soft metrics are related to a same constellation symbol; and
   rearranging the stream of compressed soft metrics so as to inverse the interleaving done in the transmitter,
   wherein the compression operation generates a plurality of compressed codes, and the method further comprises a step of substitution of the compressed codes with other codes of shorter length representing a different symbol in the predetermined constellation when the total length of the groups of the soft metrics exceeds a determined value.

2. The method of claim 1, further comprising
   decompressing the compressed soft metrics;
   processing the decompressed soft metrics in a decoder to reconstruct a transmitted message.

3. The method of claim 1, comprising a step of quantizing the soft metrics prior to an application of said compression operation.

4. The method of claim 3, wherein the compression operation includes the application of an entropy code.

5. The method of claim 3, wherein the compression operation generates a prefix code.

6. The method of claim 1, wherein said soft metrics are represented as fixed-point numbers.

7. The method of claim 3, wherein the quantizing operation generates a constant number of bits for the groups of the soft metrics.

8. The method of claim 3, where in the quantizing operation generates different number of bits for each soft metric relative to the same constellation symbol.

* * * * *